(12) United States Patent
Altmannshofer et al.

(10) Patent No.: US 9,084,296 B2
(45) Date of Patent: Jul. 14, 2015

(54) INDUCTION HEATING COIL AND METHOD FOR MELTING GRANULES COMPOSED OF SEMICONDUCTOR MATERIAL

(75) Inventors: Ludwig Altmannshofer, Massing (DE); Joerg Fischer, Berling (DE); Helge Riemann, Schulzendorf (DE); Wilfried von Ammon, Hochburg (AT)

(73) Assignee: Siltronic AG, Munich (DE)

( * ) Notice: Subject to any disclaimer, the term of this patent is extended or adjusted under 35 U.S.C. 154(b) by 1682 days.

(21) Appl. No.: 12/393,154

(22) Filed: Feb. 26, 2009

(65) Prior Publication Data

US 2009/0223949 A1 Sep. 10, 2009

(30) Foreign Application Priority Data

Mar. 10, 2008 (DE) .......................... 10 2008 013 326

(51) Int. Cl.
| H05B 6/36 | (2006.01) |
| H05B 6/10 | (2006.01) |
| C30B 11/00 | (2006.01) |
| C30B 13/20 | (2006.01) |

(52) U.S. Cl.
CPC ............... *H05B 6/10* (2013.01); *C30B 11/001* (2013.01); *C30B 11/003* (2013.01); *C30B 13/20* (2013.01); *H05B 6/36* (2013.01)

(58) Field of Classification Search
CPC ........ C30B 29/06; C30B 13/08; C30B 13/10; C30B 13/14; C30B 13/16; C30B 13/20; C30B 15/08; H05B 6/10; H05B 6/20; H05B 6/36; H05B 6/42

USPC ............... 117/49, 23, 13, 11, 33, 73, 74, 200, 117/222, 223; 219/672, 638, 675, 676; 373/142, 144, 138, 147, 152, 153, 139
See application file for complete search history.

(56) References Cited

U.S. PATENT DOCUMENTS

| 4,157,373 | A | | 6/1979 | Berkman et al. | |
| 4,220,839 | A | * | 9/1980 | De Leon | 219/638 |
| 4,538,279 | A | | 8/1985 | Keller | |
| 4,797,525 | A | * | 1/1989 | Keller | 219/638 |
| 4,833,287 | A | | 5/1989 | Abe et al. | |
| 5,550,354 | A | * | 8/1996 | Kimura et al. | 219/673 |
| 5,902,508 | A | * | 5/1999 | Kimura et al. | 219/638 |
| 2003/0145781 | A1 | | 8/2003 | Von Ammon | |
| 2005/0279275 | A1 | | 12/2005 | Holder | |
| 2005/0279278 | A1 | * | 12/2005 | Holder | 117/23 |
| 2006/0292890 | A1 | | 12/2006 | Ammon et al. | |

FOREIGN PATENT DOCUMENTS

| CN | 101006205 A | 7/2007 |
| DE | 102 04 178 A1 | 9/2003 |
| JP | 08268792 A | 10/1996 |
| JP | 2003226595 A | 8/2003 |
| WO | 2006009802 A3 | 1/2006 |

* cited by examiner

*Primary Examiner* — Tu B Hoang
*Assistant Examiner* — Hung D Nguyen
(74) *Attorney, Agent, or Firm* — Brooks Kushman P.C.

(57) ABSTRACT

An induction heating coil melts granules composed of semiconductor material on a plate with an outlet tube. The induction heating coil has a coil body provided with current-guiding slots, the coil body having an upper side and a lower side and having a passage opening for granules in a region of the coil body that lies outside the center of the coil, and current-carrying segments which project from the center of the lower side of the coil body and which are electrically conductively connected by a web at a lower end.

15 Claims, 4 Drawing Sheets

INDUCTION HEATING COIL AND METHOD FOR MELTING GRANULES COMPOSED OF SEMICONDUCTOR MATERIAL

CROSS-REFERENCE TO RELATED APPLICATIONS

This application claims priority to German application DE 10 2008 013 326.4. filed Mar. 10, 2008, which is herein incorporated by reference.

BACKGROUND OF THE INVENTION

1. Field of the Invention

The invention relates to an induction heating coil and a method for melting granules composed of semiconductor material on a plate with an outlet tube. An induction heating coil of this type is required, in accordance with DE 102 04 178 A1, in order to be able to produce a single crystal of semiconductor material with granules as raw material.

2. Background Art

FIG. 4 shows a known induction heating coil in an arrangement during the production of a single crystal. The granules melted with the aid of the induction heating coil flow through an opening in the center of the plate with formation of a funnel-shaped film of semiconductor material into a melt. The melt forms a reservoir which, controlled by a pulling coil, crystallizes to a single crystal while increasing the volume thereof. For the crystal growth to proceed without any disturbances it is important, inter alia, for the film and the adjoining melt to remain liquid. In order to preclude uncontrolled freezing of the film and the melt, a radiant heating system is present. However, such a radiant heating system is complicated and not very efficient because the majority of the radiation impinging on the film is reflected and thus remains ineffective. Furthermore, the film and the melt cannot be heated uniformly because the respective angles of incidence of the radiation differ significantly.

SUMMARY OF THE INVENTION

It is an object of the present invention to achieve uniform heating of the film and of the adjoining melt more simply and more effectively. These and other objects are provided by an induction heating coil for melting granules composed of semiconductor material on a plate with an outlet tube, comprising a coil body provided with current-guiding slots and having an upper and a lower side and having a passage opening for granules in a region of the coil body that lies outside the center, and current-carrying segments which project in the center of the lower side of the coil body and which are electrically conductively connected by a web at a lower end.

DETAILED DESCRIPTION OF THE PREFERRED EMBODIMENT(S)

The invention thus relates to an induction heating coil for melting granules composed of semiconductor material on a plate with an outlet tube, comprising a coil body provided with current-guiding slots and having an upper and a lower side and having a passage opening for granules in a region of the coil body that lies outside the center, and current-carrying segments which project in the center of the lower side of the coil body and which are electrically conductively connected by a web at a lower end.

The invention also relates to a method for melting granules composed of semiconductor material on a plate with an outlet tube by means of an induction heating coil, comprising forming a film of molten semiconductor material which wets the outlet tube, and a melt of semiconductor material with a free surface which is surrounded by the film, wherein the film and the melt are heated in the region of the free surface by means of current-carrying segments which project in the center of the underside of the induction heating coil and which are electrically conductively connected by a web at a lower end.

According to the invention, the induction heating coil for melting the granules is also used for inductively heating the film and the adjoining upper region of the melt and for keeping them liquid. This achieves the aim of ensuring a continuous and controllable melt flow from the plate to the single crystal. For this purpose, the coil body has current-carrying segments which project in the center of the lower side of the coil body and protrude into the channel delimited by the film of semiconductor material toward the side and by the melt at the bottom. The segments are preferably configured in such a way that inductive heating of the film and of the melt is particularly effective in the region of the free surface of the melt that is surrounded by the film. A shape of the segments on the basis of which the volume of the channel is almost completely filled by the segments is particularly preferred. Therefore, the segments are formed for example as two segments which form the shape of a truncated cone and which are electrically conductively connected to one another by a web at their lower end.

Figure 1:
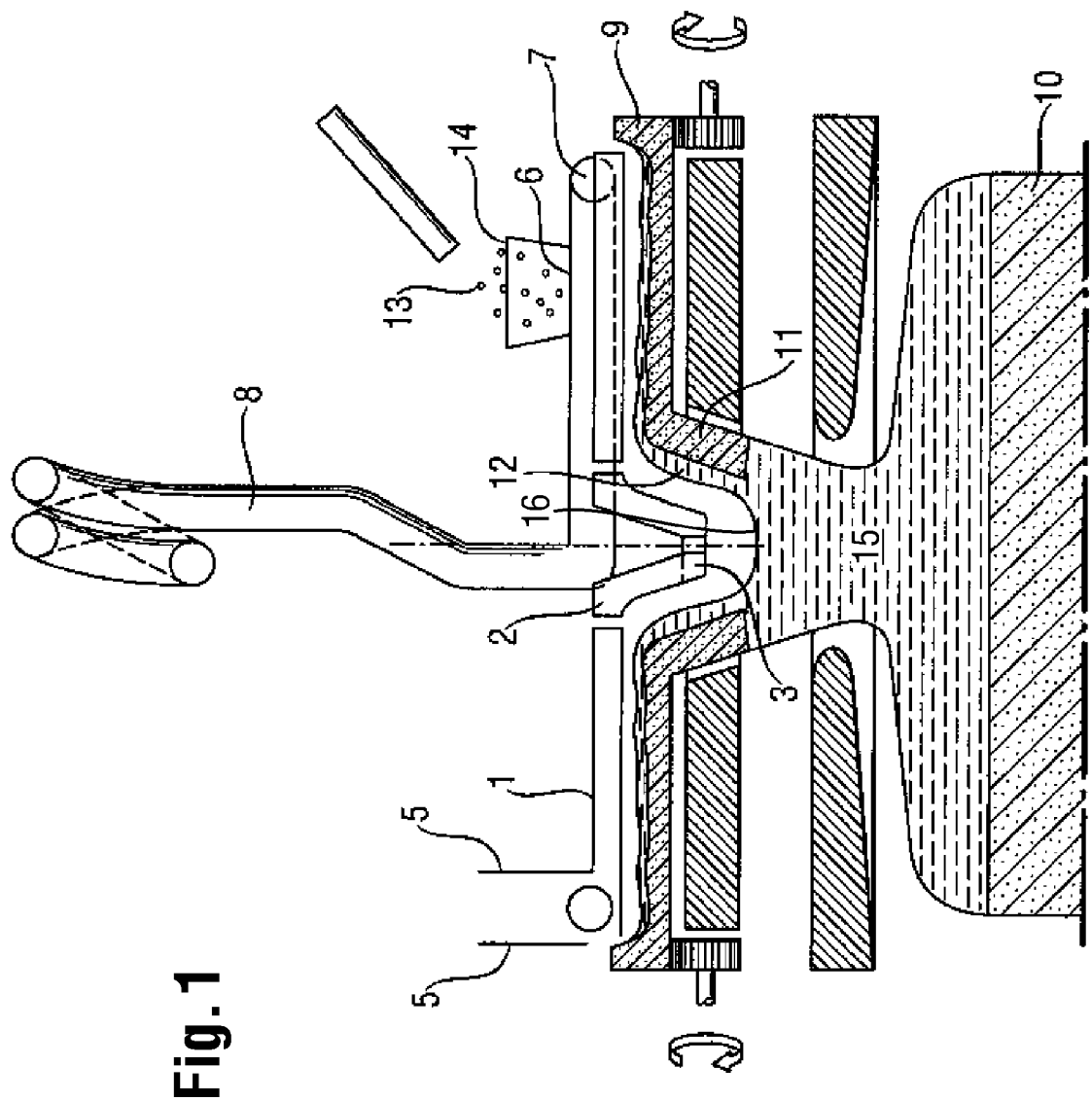
FIG. 1 illustrates one embodiment of the subject invention induction heating coil.
Figure 2:
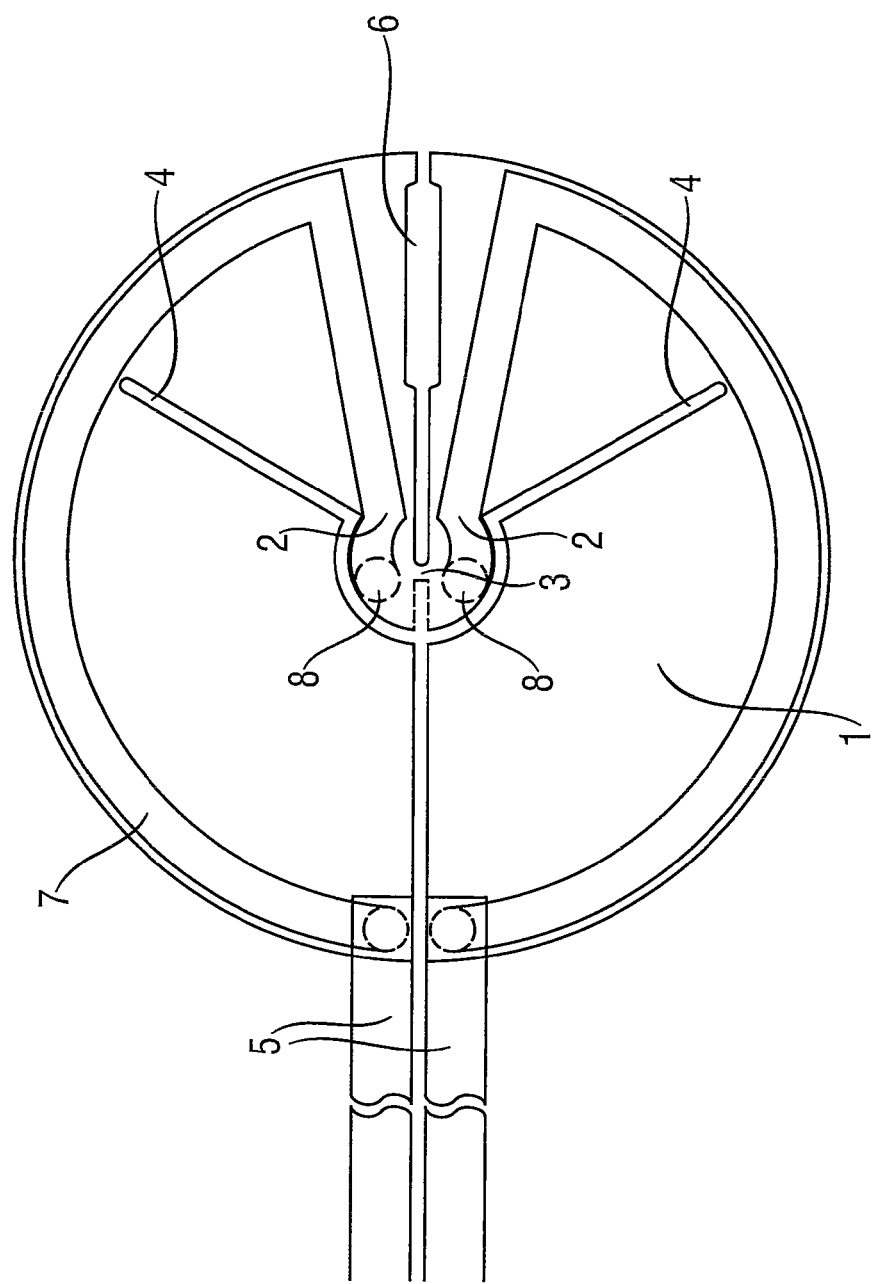
FIG. 2 illustrates the induction heating coil of FIG. 1 in plan view.
Figure 3:
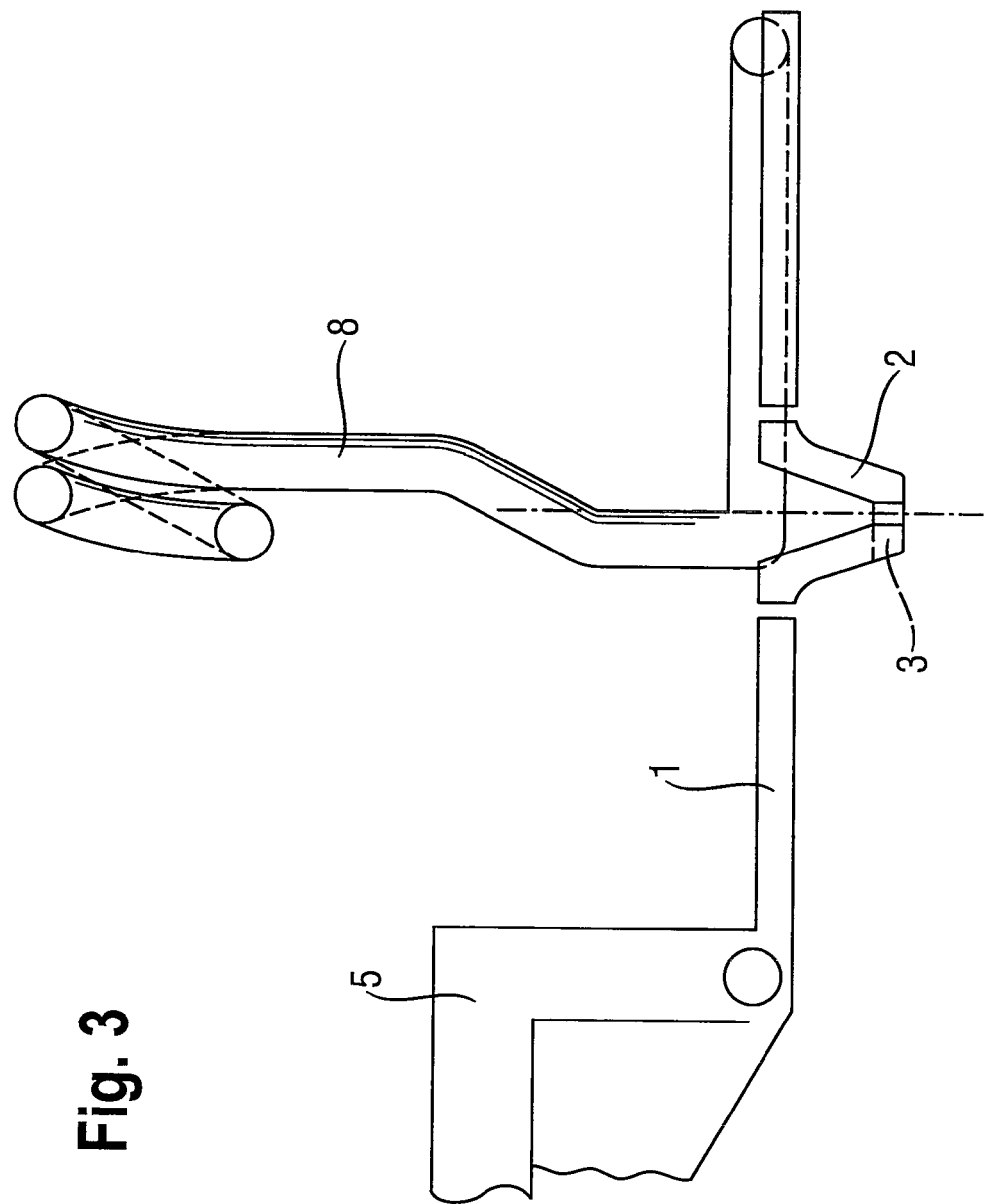
FIG. 3 illustrates the induction heating coil of FIG. 1 in a cross-sectional view.
Figure 4:
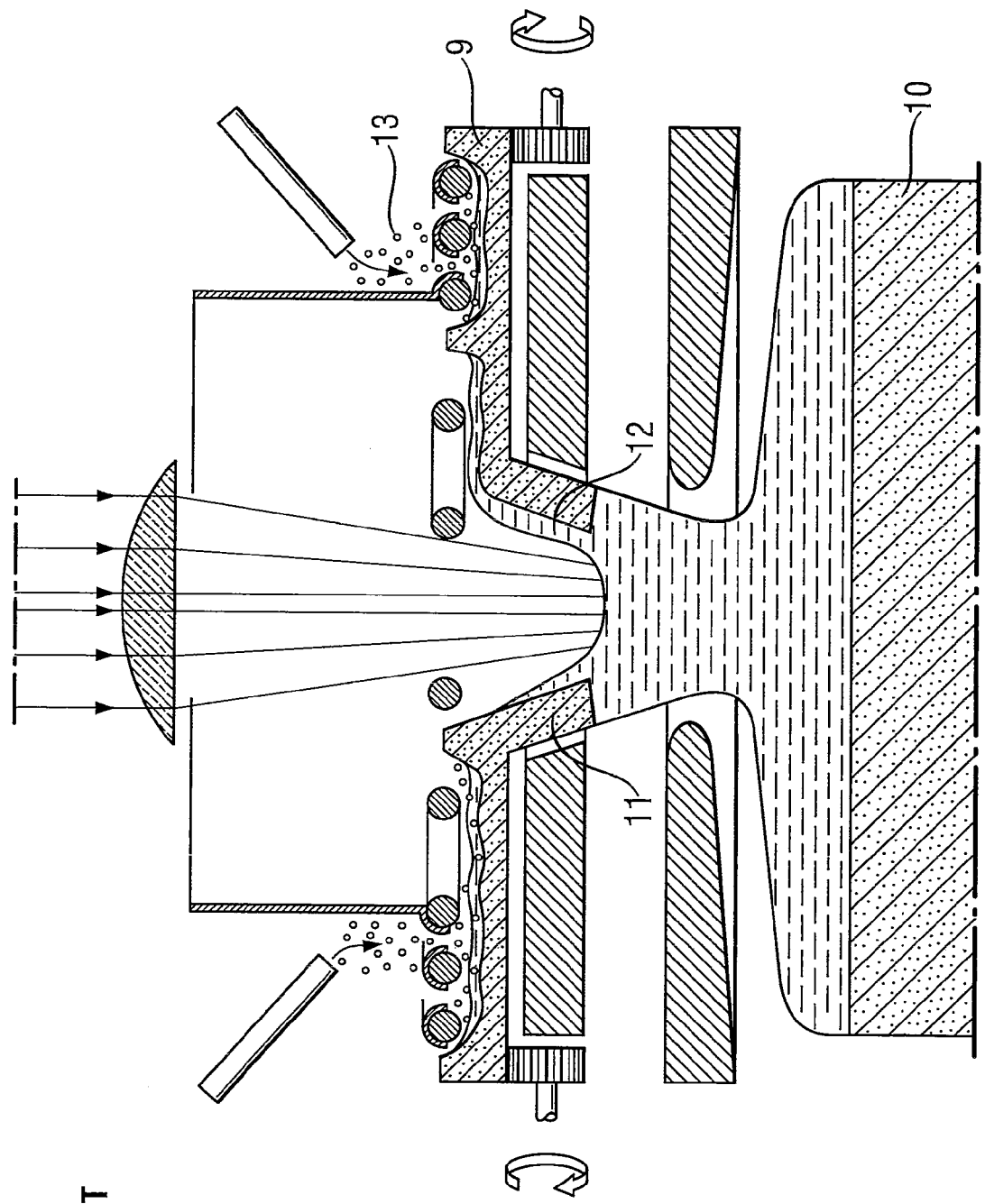
FIG. 4 illustrates a prior art induction heating coil.

This and further features of the invention are illustrated in greater detail below with the aid of figures. FIG. 1 shows, in a schematic longitudinal sectional illustration, a preferred embodiment of the induction heating coil according to the invention in an arrangement during operation. FIGS. 2 and 3 show the induction heating coil in plan view and in cross-sectional illustration. FIG. 4 is an illustration which corresponds to FIG. 1 and which represents the prior art. Features of identical type are identified by the same reference numerals.

The induction heating coil is formed in such a way that the radio frequency current essentially flows through the coil body 1 and the segments 2 (FIGS. 2 and 3). The segments are electrically conductively connected to one another by a thin web 3 at their lower end. The coil body has radially directed current-guiding slots 4 which constrain a current flow on a meandering path through the coil body. The path leads from coil connections 5 at the edge of the coil body 1 to the segments 2 in the coil center, through the segments and through the coil body again back to the coil connections. It is ensured in this way that all regions of the surface of the plate are covered equally by the electromagnetic field, which induces there the current for melting granules and for maintaining the molten state.

The coil body 1 has in an outer region at least one passage opening 6 for feeding granules composed of semiconductor material onto the rotating plate. The passage opening is preferably formed by one of the current-guiding slots 4, which is widened in a section for this purpose.

The induction heating coil is furthermore equipped with a cooling system comprising cooling channels 7 in the coil body 1, through which a coolant, for example water, flows. In order also to obtain intensive cooling of the segments 2, the cooling channels are led to the segments and connected to one another via a tube bridge 8. The tube bridge reaches in the center of the upper side of the coil body 1 as far as the segments 2 and is for example soldered or welded thereto. The tube bridge 8 is singly or multiply wound, such that it has a sufficiently high inductance. The radio frequency current therefore essentially flows via the web 3 connecting the segments 2, and not via the tube bridge 8. By virtue of the current flow, the field line density is particularly high in the region of the web and the inductive heating of the melt that is directly opposite the web during the production of a single crystal is particularly effective. Preferably the same electrical potential, most preferably ground potential, is present at the melt and the web.

A preferred relative arrangement of the induction heating coil and of the plate 9 during the production of a single crystal 10 is illustrated in FIG. 1. The segments 2 form a truncated cone and reach almost as far as the free surface 16 of the melt 15 in the region of the web 3. The film 12 of molten semiconductor material flowing from the outlet tube 11 of the plate 9 encloses a channel, the volume of which is almost completely filled by the current-carrying segments 2. Preferably, the angle of inclination of the outer surface of the segments and the angle of inclination of the inner surface of the outlet tube are identical. The continuous flow of molten semiconductor material from the plate to the melt can additionally be improved by the truncated cone being positioned a little asymmetrically in the channel and one side thus being preferentially heated. As a result, a defined closed melt path forms at the beginning of the growth process, when as yet little melt flow is required.

The plate 9 is preferably composed of the same semiconductor material as the granules 13 and is preferably embodied in a manner like the container which is described in DE 102 04 178 A1, the disclosure of which is hereby expressly incorporated by reference. However, it can also be embodied as a simple flat slab with a central outlet tube, particularly if it is used for melting granules for producing single crystals having comparatively small diameters. The reference numeral 14 denotes a funnel into which the granules 13 are conveyed.

The invention is preferably used for producing single crystals composed of silicon. The semiconductor wafers cut from the single crystals are suitable for example for producing solar cells or electronic components, for example power transistors and thyristors.

EXAMPLE

With an induction heating coil according to the invention in an arrangement in accordance with FIG. 1, single crystals composed of silicon were produced without providing a radiant heating system for the channel and the adjoining melt. The pulled single crystals were free of dislocations and no loss of yield arose as a result of silicon solidifying in the film or in the adjoining region of the melt.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. An induction heating device comprising an induction heating coil and a plate for melting semiconductor granules on the plate, said plate having an outlet tube extending below a bottom surface of the plate, said induction heating coil being positioned above the plate and comprising a coil body and current-carrying segments, the coil body being provided with current-guiding slots and having an upper and a lower side and a passage opening for granules in a region of the coil body that lies outside a center of the plate, said current-carrying segments are electrically conductively connected by a web at a lower end and project downwards into the outlet tube from a center of the lower side of the coil body to a level which is lower than a level of a periphery of the lower side of the coil body.

2. The induction heating device of claim 1, wherein at least one of the current-guiding slots is widened in order to form the passage opening for granules.

3. The induction heating device of claim 1, wherein said current carrying segments form the shape of a truncated cone.

4. The induction heating device of claim 3, wherein the current-carrying segments forming the shape of the truncated cone are positioned asymmetrically within a channel bounded by a film of semiconductor material on walls of the outlet tube.

5. The induction heating device of claim 3, wherein the angle of inclination of outer surfaces of the current-carrying segments and the angle of inclination of the inner surface of the outlet tube are identical.

6. The induction heating device of claim 1, wherein the angle of inclination of the-outer surfaces of the current-carrying segments and the angle of inclination of the inner surface of the outlet tube are identical.

7. The induction heating device of claim 1, further comprising a cooling system for cooling the coil body and the current-carrying segments.

8. The induction heating device of claim 7, wherein the cooling system comprises a wound tube bridge through which coolant flows and which is in contact with the current-carrying segments in the center of the upper side of the coil body.

9. The induction heating device of claim 8, wherein windings of the wound tube bridge have a high inductance for RF electrical energy flowing through the induction heating coil.

10. The induction heating device of claim 1, wherein an electrical current flowing through the induction coil body also flows through the current carrying segments and the web.

11. The induction heating device of claim 1, wherein the induction heating coil is a flat coil having a peripheral cooling channel.

12. A method for melting granules composed of semiconductor material by means of an induction heating device comprising an induction heating coil and a plate for melting semiconductor granules on the plate, said plate having an outlet tube extending below a bottom surface of the plate, said induction heating coil being positioned above the plate and comprising a coil body and current-carrying segments, the coil body being provided with current-guiding slots and having an upper and a lower side and a passage opening for granules in a region of the coil body that lies outside a center of the plate, said current-carrying segments are electrically conductively connected by a web at a lower end and project downwards into the outlet tube from a center of the lower side of the coil body to a level which is lower than a level of a periphery of the lower side of the coil body, the method comprising forming a film of molten semiconductor material which wets the outlet tube and an upper surface of a melt of semiconductor material which is surrounded by the film, wherein the film and the melt of semiconductor material are heated in the region of the upper surface by the induction heating coil.

13. The method of claim 12, wherein the semiconductor material comprises granules of silicon which are melted on the plate which is composed of silicon.

14. The method of claim 12, wherein the web and the melt are at the same electrical potential.

15. The method of claim 12, wherein the web projects into the outlet tube extending below the bottom surface of the plate.

* * * * *

UNITED STATES PATENT AND TRADEMARK OFFICE
CERTIFICATE OF CORRECTION

PATENT NO. : 9,084,296 B2  
APPLICATION NO. : 12/393154  
DATED : July 14, 2015  
INVENTOR(S) : Ludwig Altmannshofer et al.

Page 1 of 1

It is certified that error appears in the above-identified patent and that said Letters Patent is hereby corrected as shown below:

In the Claims

Column 4, Line 29, Claim 6:

After "angle of inclination"  
Delete "the-outer" and  
Insert -- the outer --.

Signed and Sealed this  
Fifth Day of January, 2016

Michelle K. Lee  
*Director of the United States Patent and Trademark Office*